United States Patent
McGaughy et al.

(10) Patent No.: US 7,434,183 B2
(45) Date of Patent: Oct. 7, 2008

(54) METHOD AND SYSTEM FOR VALIDATING A HIERARCHICAL SIMULATION DATABASE

(75) Inventors: Bruce W. McGaughy, Fremont, CA (US); Jun Kong, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 231 days.

(21) Appl. No.: 11/206,714

(22) Filed: Aug. 17, 2005

(65) Prior Publication Data

US 2007/0044051 A1    Feb. 22, 2007

(51) Int. Cl.
G06F 17/50    (2006.01)

(52) U.S. Cl. .................... 716/5; 716/4; 716/6; 703/14

(58) Field of Classification Search .............. 716/4–6; 703/14

See application file for complete search history.

(56) References Cited

U.S. PATENT DOCUMENTS

| | | | | |
|---|---|---|---|---|
| 5,163,016 A * | 11/1992 | Har'El et al. | ................... | 716/5 |
| 5,379,231 A * | 1/1995 | Pillage et al. | .................. | 703/14 |
| 5,469,366 A * | 11/1995 | Yang et al. | ...................... | 716/6 |
| 5,617,326 A * | 4/1997 | Yamamoto | ................... | 703/14 |
| 5,668,732 A * | 9/1997 | Khouja et al. | .................. | 702/60 |
| 6,134,513 A * | 10/2000 | Gopal | .......................... | 703/14 |
| 6,249,901 B1 * | 6/2001 | Yuan et al. | ....................... | 716/5 |
| 6,438,734 B1 * | 8/2002 | Lu | .................................. | 716/7 |
| 6,499,129 B1 * | 12/2002 | Srinivasan et al. | ............. | 716/4 |
| 6,763,504 B2 * | 7/2004 | Rao et al. | ....................... | 716/4 |
| 6,789,237 B1 * | 9/2004 | Ismail | ............................ | 716/4 |
| 7,181,383 B1 * | 2/2007 | McGaughy et al. | ........... | 703/14 |
| 7,243,313 B1 * | 7/2007 | Qin et al. | ........................ | 716/2 |
| 7,254,790 B2 * | 8/2007 | Lee et al. | ........................ | 716/4 |
| 7,272,805 B2 * | 9/2007 | McGaughy et al. | ............ | 716/3 |
| 2004/0117697 A1 * | 6/2004 | Patzer et al. | ................. | 714/724 |
| 2004/0153982 A1 * | 8/2004 | Zhang et al. | ................... | 716/4 |
| 2005/0273298 A1 * | 12/2005 | Shah | ............................. | 703/2 |
| 2006/0031055 A1 * | 2/2006 | Sheehan | ...................... | 703/14 |
| 2006/0111884 A1 * | 5/2006 | McGaughy et al. | ........... | 703/14 |
| 2006/0112356 A1 * | 5/2006 | McGaughy et al. | ............ | 716/3 |
| 2006/0161413 A1 * | 7/2006 | Wei et al. | ...................... | 703/14 |
| 2006/0200786 A1 * | 9/2006 | Chang | ........................... | 716/6 |

* cited by examiner

*Primary Examiner*—Jack Chiang
*Assistant Examiner*—Naum B Levin
(74) *Attorney, Agent, or Firm*—Wheelock Chan LLp; Thomas Chan (57) ABSTRACT

System and method for validating a circuit for simulation are disclosed. The system includes at least one processing unit for executing computer programs, a graphical user interface for viewing representations of the circuit on a display, a memory for storing information of the circuit, and logic for representing the circuit in a hierarchical data structure, where the hierarchical data structure has a plurality of subcircuits arranged in a connected graph, and where each subcircuit has circuit elements and one or more input and output ports. The system further includes logic for traversing the hierarchical data structure in a bottom-up fashion, logic for recording input port to output port (port-to-port) properties of the subcircuits in the hierarchical data structure, logic for traversing the hierarchical data structure in a top-down fashion, and logic for identifying illegal port paths using the port-to-port properties of the subcircuits.

30 Claims, 6 Drawing Sheets

METHOD AND SYSTEM FOR VALIDATING A HIERARCHICAL SIMULATION DATABASE

FIELD OF THE INVENTION

The present invention relates to the field of electronic design automation tools. In particular, the present invention relates to a method and system for validating a hierarchical simulation database.

BACKGROUND OF THE INVENTION

The development of complicated integrated circuits often requires powerful numerical simulation programs. For example, circuit simulation is an essential part in the design flow of integrated circuits, helping circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as SPECTRE, developed by Cadence Design Systems, Inc. SPICE and its derivatives or enhanced versions will be referred to hereafter as SPICE circuit simulators, or SPICE.

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in a matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j (=1, \ldots, n)$ represents the voltage or terminal bias across terminal j and a reference terminal, such as the ground; and t represents the time. The Kirchhoff's Current Law implies that the current entering terminal n is given by:

$$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by:

$$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

A complex integrated circuit may contain millions of circuit elements such as transistors, resistors, and capacitors. The design and simulation of such a complex integrated circuit may involve multiple teams of engineers. It is advantageous to partition the design of such complex integrated circuit using a hierarchical approach, whereby certain circuit elements are grouped together and may be reused repeatedly throughout the integrated circuit or in a subsequent design. A method and system for design and simulation of an integrated circuit with a hierarchical data structure are disclosed by U.S. patent application Ser. No. 10/724,277, entitled "System and Method for Simulating a Circuit Having Hierarchical Structure," filed on Nov. 26, 2003 and commonly owned by Cadence Design Systems, Inc., which is incorporated expressly by reference in its entirety herein.

Hierarchical simulation is most useful when it can also be applied to simulate a back-annotated flat netlist containing parasitic networks. During back-annotation, a flat netlist in DSPF (Detailed Standard Parasitic Format) or SPEF (Standard Parasitic Exchange Format) that consists of millions of RC elements is produced by a process called Parasitic Extraction. In other words, a back-annotated netlist is a description of a group of circuit elements and their corresponding connectivity in terms of parasitic properties of the circuit elements, such as resistance, capacitance, and inductance. The back-annotated flat netlist is also referred to as post-layout netlist, gate-level netlist, or flat netlist. A method and system for creating a hierarchical representation of a back-annotated netlist are described in U.S. patent application Ser. No. 10/993,686, entitled "System and Method for Converting a Flat Netlist into a Hierarchical Netlist"; and a method and system for determining electrical isomorphism between electrical networks in a back-annotated netlist are disclosed in U.S. patent application Ser. No. 10/993,687, entitled "Electrical Isomorphism", which are incorporated herein in their entirety by reference.

Despite the recent advancements in SPICE simulation technology, the post-layout netlist verification using circuit simulation is still a very time consuming task because of the very large number of circuit elements integrated into a single chip. In situations where a simulation runs very slowly or terminates inadvertently due to large partitions, non-convergence matrix, singular matrix, or illegal voltage source and/or inductor loops, it may take designers days or even weeks to identify the underlying root cause of the simulation failure. In other cases, errors may be mistakenly introduced in the synthesis flow, in the extraction flow, or in the test environment.

Figure 1A:
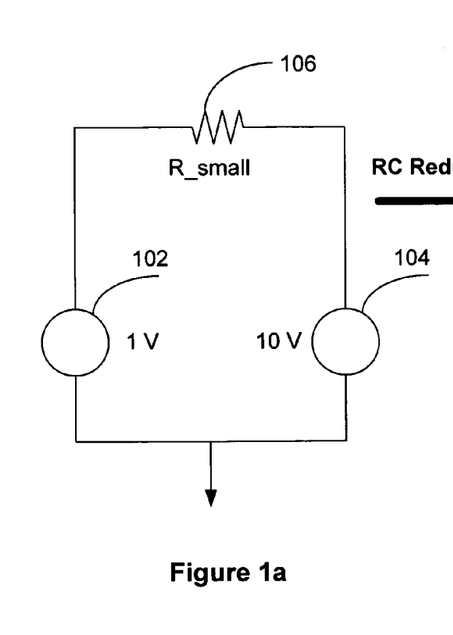
FIG. 1a illustrates a subcircuit before an RC reduction process is applied to the subcircuit.
Figure 1B:
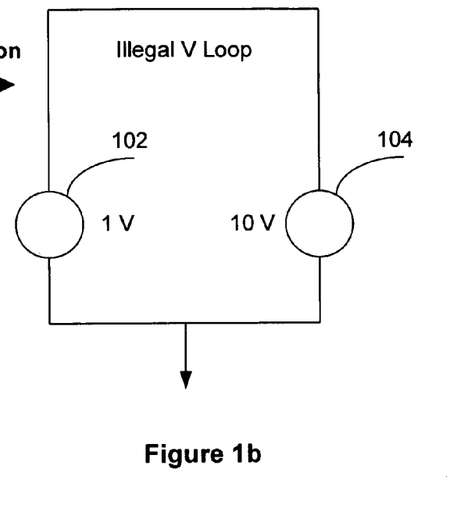
FIG. 1b illustrates the subcircuit of FIG. 1a after an RC reduction process is applied to the subcircuit.

RC reduction is a common technique used to speed up the simulation of the post-layout netlist. However, illegal voltage source and/or inductor loops may be produced as side effects of the RC reduction of the post-layout netlist. FIG. 1a and FIG. 1b illustrate an illegal voltage loop introduced by the RC reduction process. As shown in FIG. 1a, prior to RC reduction, the circuit includes a 1V voltage source 102, a 10V voltage source 104, and a small resistor 106. After the RC reduction process, the small resistor 106 is removed, which results in the circuit shown in FIG. 1b. Thus, an illegal voltage source loop is formed by having only the 1V and 10V voltage sources in a loop.

Figure 1C:
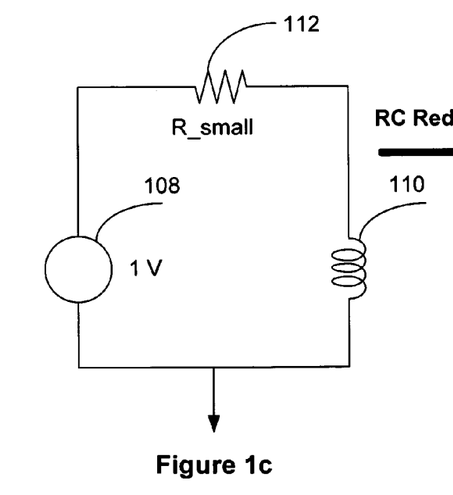
FIG. 1c illustrates another subcircuit before an RC reduction process is applied to the subcircuit.
Figure 1D:
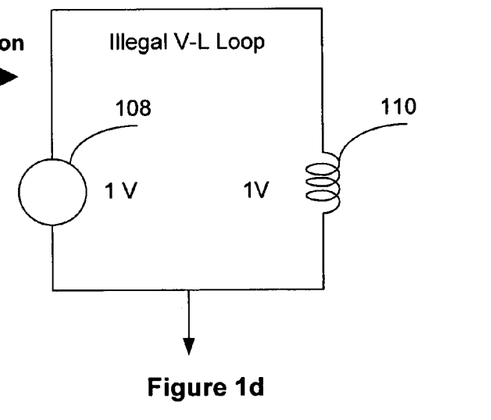
FIG. 1d illustrates the subcircuit of FIG. 1c after an RC reduction process is applied to the subcircuit.

Another problem of RC reduction is that illegal voltage-inductor loops may be introduced. FIG. 1c and FIG. 1d illustrate an illegal voltage-inductor loop. As shown in FIG. 1c, prior to RC reduction, the circuit includes a 1V voltage source 108, an inductor 110, and a small resistor 112. After the RC reduction process, the small resistor 112 is removed, which results in the circuit shown in FIG. 1d. As a result, an illegal voltage-inductor loop is formed by having only the 1V voltage source 108 and the inductor 110 in a loop.

Note that the voltage source and/or inductor (V-L) loops may includes one or more voltage (V) sources only, one or more inductor (L) sources only, or a combination of one or more voltage sources and inductors. In addition, the illegal V-L loops may lead to other problems in simulation. For example, the illegal V-L loops in FIG. 1b and FIG. 1d may form singular matrix that would terminate the simulation inadvertently, non-convergence matrix that would hang the simulation, or large partitions that would slow down the simulation.

Therefore, methods and systems are needed for efficiently validating a hierarchical simulation database.

SUMMARY

In one embodiment, a method for validating a circuit for simulation includes representing the circuit in a hierarchical data structure, where the hierarchical data structure comprises a plurality of subcircuits arranged in a connected graph, and where each subcircuit has circuit elements and one or more input and output ports. The method further includes traversing the hierarchical data structure in a bottom-up fashion, recording input port to output port (port-to-port) properties of the subcircuits in the hierarchical data structure, traversing the hierarchical data structure in a top-down fashion, and identifying illegal port paths using the port-to-port properties of the subcircuits.

In another embodiment, a system for validating a circuit for simulation includes at least one processing unit for executing computer programs, a graphical user interface for viewing representations of the circuit on a display, a memory for storing information of the circuit, and logic for representing the circuit in a hierarchical data structure, where the hierarchical data structure has a plurality of subcircuits arranged in a connected graph, and where each subcircuit has circuit elements and one or more input and output ports. The system further includes logic for traversing the hierarchical data structure in a bottom-up fashion, logic for recording input port to output port (port-to-port) properties of the subcircuits in the hierarchical data structure, logic for traversing the hierarchical data structure in a top-down fashion, and logic for identifying illegal port paths using the port-to-port properties of the subcircuits.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

Like numbers are used throughout the figures.

DESCRIPTION OF EMBODIMENTS

Methods and systems are provided for validating a hierarchical simulation database. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description which follows are presented in terms of procedures, steps, logic blocks, processing, and other symbolic representations of operations on data bits that can be performed on computer memory. A procedure, computer-executed step, logic block, process, etc., are here conceived to be a self-consistent sequence of steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system.

These signals may be referred to at times as bits, values, elements, symbols, characters, terms, numbers, or the like. Each step may be performed by hardware, software, firmware, or combinations thereof.

Figure 2:
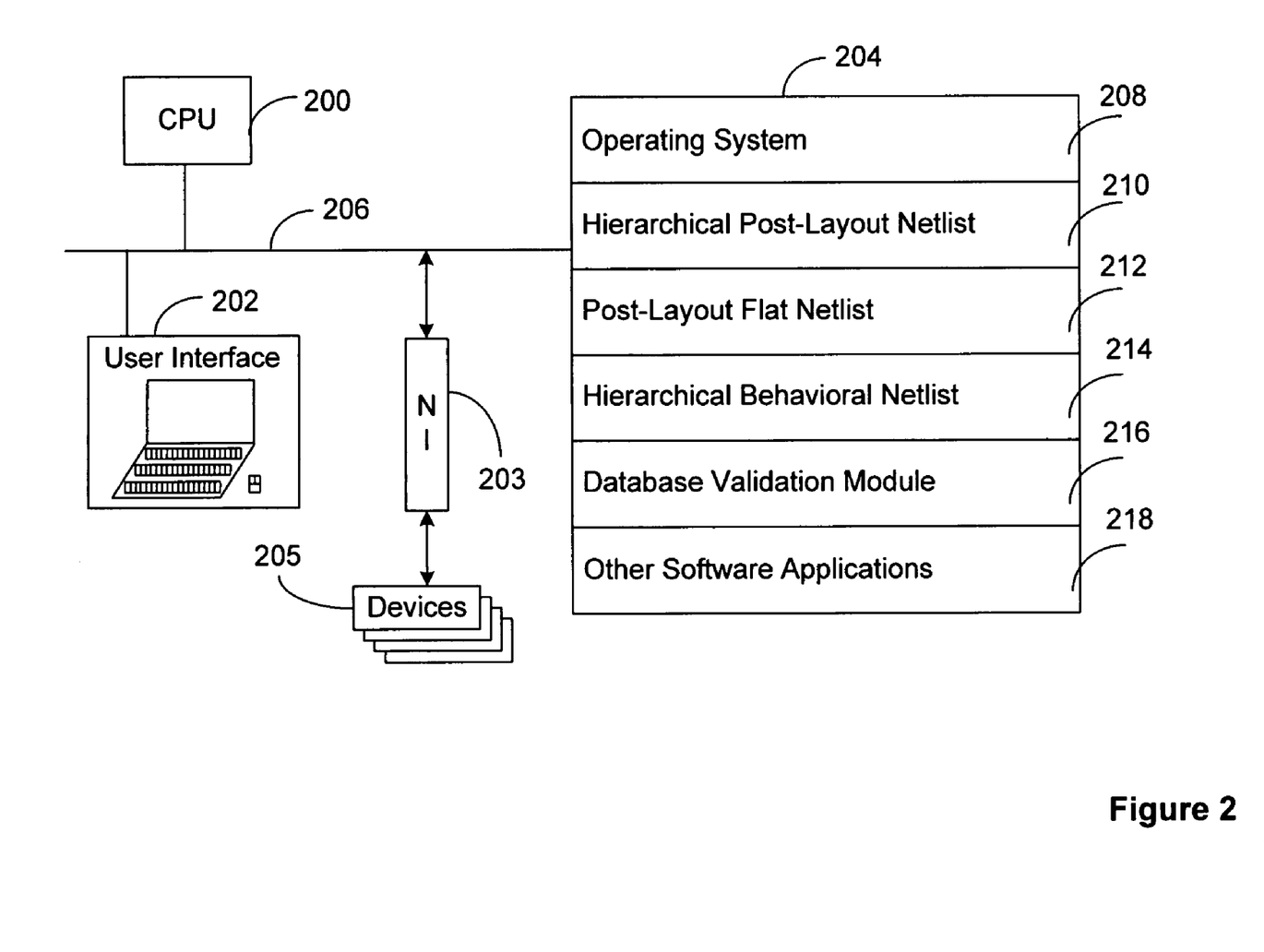
FIG. 2 illustrates a system for validating a hierarchical simulation database according to an embodiment of the present invention.

In one embodiment, a system for validating a hierarchical simulation database is implemented using a computer system schematically shown in FIG. 2. The computer system includes one or more central processing units (CPUs) 200, at least a user interface 202, a memory device 204, a system bus 206, and one or more bus interfaces for connecting the CPU, user interface, memory device, and system bus together. The computer system also includes at least one network interface 203 for communicating with other devices 205 on a computer network. In alternative embodiments, much of the functionality of the circuit simulator may be implemented in one or more application-specific integrated circuits or field-programmable gate arrays, thereby either eliminating the need for a CPU, or reducing the role of the CPU in simulating the integrated circuit.

The memory device 204 may include a high-speed random access memory or may also include a non-volatile memory, such as one or more magnetic disk storage devices. The memory device 204 may also include mass storages that are remotely located from the central process unit(s) 200. The memory device 204 preferably stores:

- an operating system 208 that includes procedures for handling various basic system services and for performing hardware-dependent tasks;
- a hierarchical post-layout netlist 210 of the circuit under simulation;
- a post-layout flat netlist 212 of the circuit under simulation;
- a hierarchical behavioral netlist 214 of the circuit under simulation;
- a database validation module 216, which includes the implementation of methods and algorithms described in the following section for validating a hierarchical simulation database; and
- other software applications 218.

The database validation module, hierarchical post-layout netlist, post-layout flat netlist, and hierarchical behavioral netlist may include executable procedures, sub-modules, tables, and other data structures. In other embodiments, additional or different modules and data structures may be used, and some of the modules and/or data structures listed above may not be used.

The method for detecting illegal V-L loops employs a two-step process. First, a bottom-up node marking algorithm is run on the back-annotated netlist by traversing each subcircuit in the hierarchical netlist in a bottom-up manner. During the bottom-up node marking process, the method examines all possible paths within a subcircuit for voltage source and/or inductor paths. As a result, input ports and output ports of the subcircuit are marked as potentially legal (L) or illegal (I) indicating a V-L path exists between the input and output ports. Note that the input and output ports are marked "potentially" legal or illegal as the final determination of whether a path is legal depends on the other circuit elements the ports are connected to. This determination is further described below in connection with the top-down path tracing algorithm. Then, the method records all groups of ports within the subcircuit. Such groups of ports are also referred to as port-to-port groups.

Second, a top-down path tracing algorithm is run on the hierarchical back-annotated netlist by traversing the netlist in a top-down manner. In the top-down path tracing process, the method uses the port-group information identified by the bottom-up node marking process and the connectivity information (which is available when examining the hierarchical netlist in a top-down manner) to identify illegal V-L loops. During the top-down path tracing process, the method may detect two or more functional calls having different port-groups reference to the same lower level subcircuit (instance). In this case, the lower level subcircuit is split into two or more subcircuits based on the port-group information and the connectivity information. This method is further described in connection with the top-down path tracing algorithm and FIGS. 5a and 5b.

Bottom-Up Node Marking Algorithm

Figure 3A:
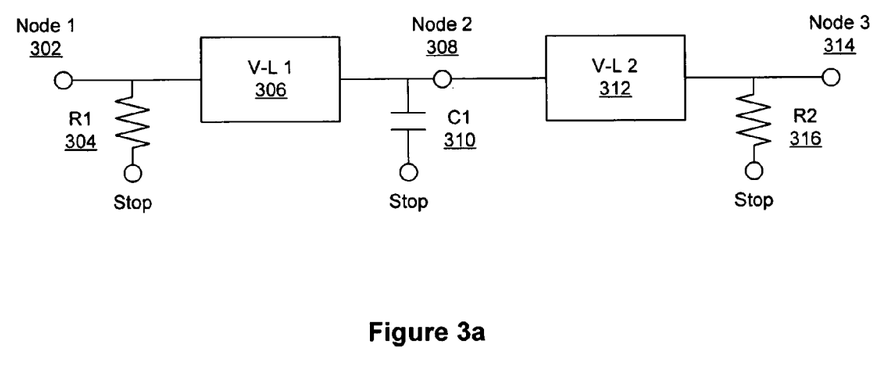
FIG. 3a illustrates a bottom-up node marking algorithm for traversing each subcircuit in the hierarchical back-annotated netlist according to an embodiment of the present invention.

FIG. 3a illustrates a bottom-up node marking algorithm for traversing each subcircuit in the hierarchical back-annotated netlist according to an embodiment of the present invention. The method traverses the hierarchical data structure from the lowest level and works its way to the top level in a bottom-up manner. In traversing each subcircuit in the netlist, the node marking process begins from each node that connects to a voltage source or to an inductor. It goes through circuit elements along the path, including voltage sources, inductors, and other circuit components. Note that a path that includes a passive circuit element such as a resistor or capacitor is deemed to be a legal path. Therefore, when a passive circuit element is detected, the method stops tracing the branch through the passive circuit element.

This is performed from one node to another either through direct current (dc) channel inside a circuit element or through the dc path inside a subcircuit referenced by a call. During the bottom-up node marking process, the port-to-port connectivity in each subcircuit is marked and stored. After traversal of the entire subcircuit circuit, input and output ports of the subcircuit are divided into one or more port-groups. Within each port-group, the input and output ports have a dc path connection to each other within each subcircuit. However, there are no dc path connections between different groups.

In the example of FIG. 3a, the method starts at Node 1 (302) and examines all possible paths to detect and record voltage source and/or inductor components. At Node 1, the node marking algorithm detects two branches. One branch includes a passive circuit element R1 (304) and the method stops tracing this branch. The second branch includes a first voltage source or inductor V-L 1 (306). The method records the V-L 1 (306) and arrives at Node 2 (308). At Node 2, the algorithm detects two branches. One branch includes a passive circuit element C1 (310) and the method stops tracing this branch. The second branch includes a second voltage source or inductor V-L 2 (312). The node marking algorithm records the V-L 2 (312) and continues to Node 3 (314). Similarly, the process is repeated at Node 3 (314), and the method stops tracing the path through R2 (316).

In one approach, each node of a subcircuit may be traversed in a depth-first-search (DFS) fashion, where the method traverses down a branch of the subcircuit in depth until all circuit components in the branch are visited. In other embodiments, the subcircuit may be traversed in a breadth-first-search (BFS) fashion, where all the circuit components at the same level are visited prior to moving down to the next lower level, until all levels of the original branch are visited. Note that both DFS and BFS techniques systematically visit every node and check every edge of the corresponding circuit graph.

After the bottom-up node marking process, the port-groups are recorded. The path that consists of ports Node 1 (302), Node 2 (308), and Node 3 (314) is recorded as a port-group and the ports are marked as potentially illegal ports as the path contains only V-L elements. As described below, in the top-down path tracing algorithm, when a instance (or call) of a subcircuit is encountered, the recorded port-groups are used in a manner similar to a dc channel inside a circuit element. As a result, an instance (or call) of a subcircuit may be used as a black-box, where the detail connectivity of circuit components within the black-box may be skipped. The top-down path tracing algorithm may jump from an input port to an output port of a pre-recorded subcircuit without revisiting the internal circuit connectivity details.

Figure 3B:
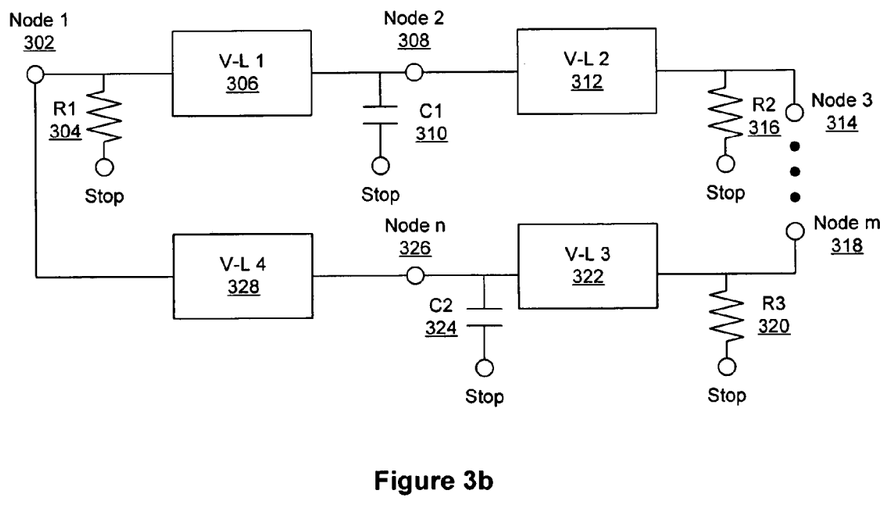
FIG. 3b illustrates a variation of FIG. 3a where a loop is detected by the bottom-up node marking algorithm according to an embodiment of the present invention.

FIG. 3b illustrates a variation of FIG. 3a where a loop is detected by the bottom-up node marking algorithm according to an embodiment of the present invention. As shown in FIG. 3b, after the Node 3 (314), the node marking algorithm continues to detect the voltage source or inductor elements along the path through Node m (318), Node n (326), and eventually back to Node 1 (302). Similar to the process described in FIG. 3a, the method stops tracing a branch when a passive circuit element, for example, R3 (320), or C2 (324), is detected. The method continues to trace and record the path when a voltage source and/or inductor, such as V-L 3 (322) or V-L 4 (328), is detected. Finally, the path returns back to Node 1 (302). A loop is completed when the same node, in this case Node 1, is visited twice by the node marking algorithm.

Note that while a circuit element usually has only a few terminals, a call can have a large number of ports. Many ports may be on the same dc path. The same path may be visited numerous times from different ports that are in the same dc path port-group. The repetitive visiting of the same path may introduce an efficiency problem. To solve this efficiency problem, the method marks a certain dc path port-group as "visited" as soon as it's visited, therefore, when a path is encountered again at some time later, the method can use the previously recorded information to avoid traversing the same path again. This technique may significantly speed up the bottom-up node marking process for a large complex circuit design.

Top-Down Path Tracing Algorithm

Figure 4:
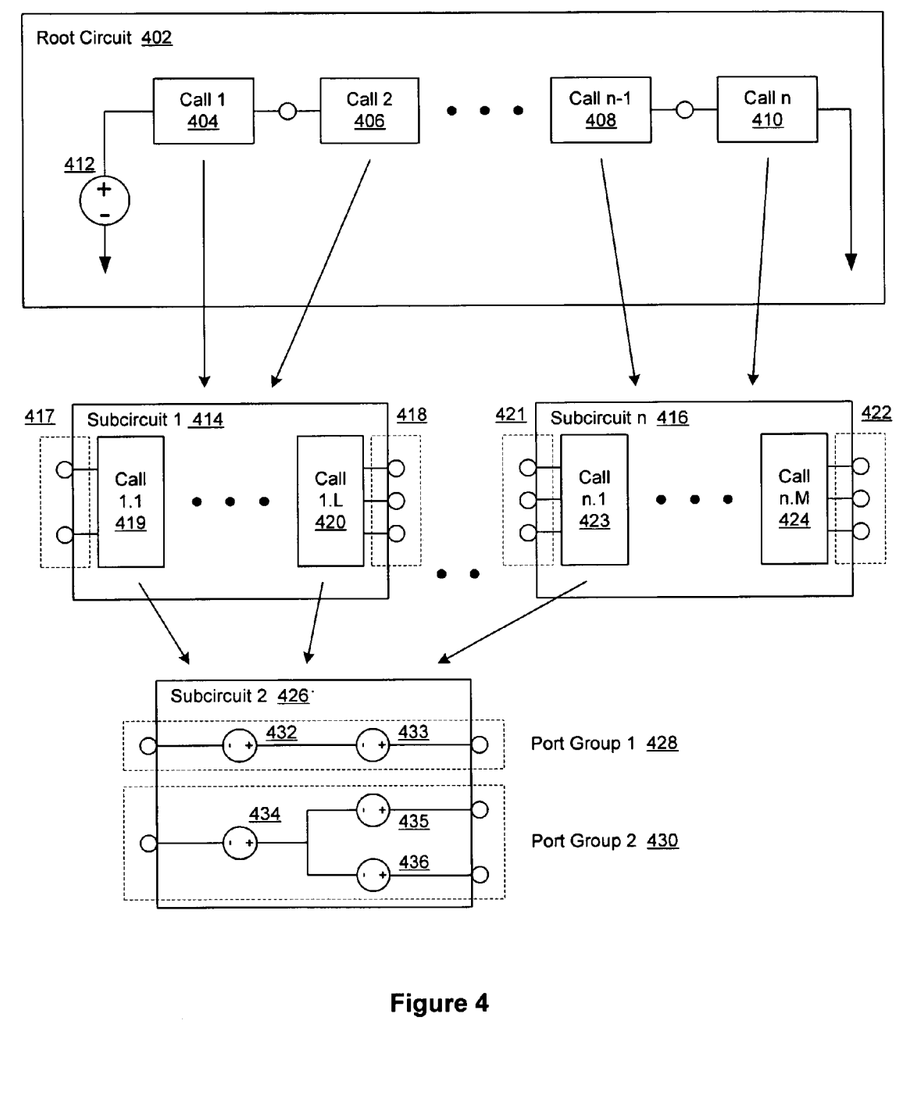
FIG. 4 illustrates a top-down path tracing algorithm for identifying illegal V-L loops according to an embodiment of the present invention.

FIG. 4 illustrates a top-down path tracing algorithm for identifying illegal V-L loops according to an embodiment of the present invention. The top-down path tracing algorithm starts at a circuit ground node. The method traverses from node to node through circuit elements and functional calls. The method uses information from the dc channel of circuit elements, and the dc port-groups of subcircuits (calls) and traverses directly from one port node to another in order to identify illegal V-L loops in the hierarchical back-annotated netlist.

As shown in FIG. 4, the hierarchical netlist includes a root circuit 402 that has n functional calls, namely Call 1 (404), Call 2 (406), Call n−1 (408), Call n (410), etc. The root circuit further includes a power source 412, which drives the circuit elements referenced by the n function calls. Each function call at one level may reference other subcircuits in a lower level. For example, Call 1 (404) and Call 2 (406) are referenced to a subcircuit 1 (414), while Call n−1 (408) and Call n (410) are referenced to a subcircuit n (416). Each subcircuit has its own functional calls, input ports, and output ports. For example, subcircuit 1 includes input ports 417, output ports 418, and L calls from Call 1.1 (419) to Call 1.L (420). Similarly, subcircuit n (416) includes input ports 421, output ports 422, and M calls from Call n.1 (423) to Call n.M (424). The functional calls Call 1.1 (419), Call 1.L (420), and Call n.1 (423) further reference subcircuit 2 (426). In this example, the subcircuit 2 includes a first port-group (port-group 1 428) and a second port-group (port-group 2430). The first port-group includes two voltage sources 432 and 433. The second port-group includes three voltage sources 434, 435, and 436. Each port-group may be a part of a potentially illegal voltage source and/or inductor loop.

Upon traversing the hierarchical netlist and detecting a V-L loop, the method determines whether the loop consists of voltage sources exclusively. The method computes the total voltage value of the loop if the loop consists of only voltage source(s). If the total voltage value is not zero, then the loop is deemed to be an illegal voltage source loop. An error or warning message may be created to inform the designer of this illegal voltage source loop. In the alternative, if the total voltage value is zero, then the loop is deemed to be a legal loop. To avoid ambiguity, this legal voltage source loop may be broken up into two circuit branches at a node chosen by the designer.

If a loop contains one or more resistors having a total resistance less than a predetermined resistance value, the method computes the total resistance of the one or more resistors in the loop. If the total resistance is larger than a predefined threshold resistance, then the loop is deemed to be a legal loop. In the alternative, if the total resistance is less than a predefined threshold resistance, an error message is posted to alert the designer of the potential design issue. As part of the top-down path tracing process, a detailed list of nodes and element names along the loop is recorded. The list of nodes and element names are used to identify the loop from the netlist, and allows the designer to fix the loop according to the criteria of the particular design.

During the top-down path tracing process, the method can apply the pre-recorded connectivity information and avoid repetitively traversing the lower-level subcircuits. Instead, the top-down path tracing process treats the instance (or call) of a lower level subcircuit as a black-box, and may directly jump from an input port node to an output port node of the instance (or call) according to the information recorded in the bottom-up node marking process. This method traverses each subcircuit in the hierarchy, first in the bottom-up node marking process and second in the top-down path tracing process. This reduces the need for repetitively visiting a particular subcircuit when the same subcircuit is referenced multiple times. As a result, the efficiency of the method is increased significantly.

Figure 5A:
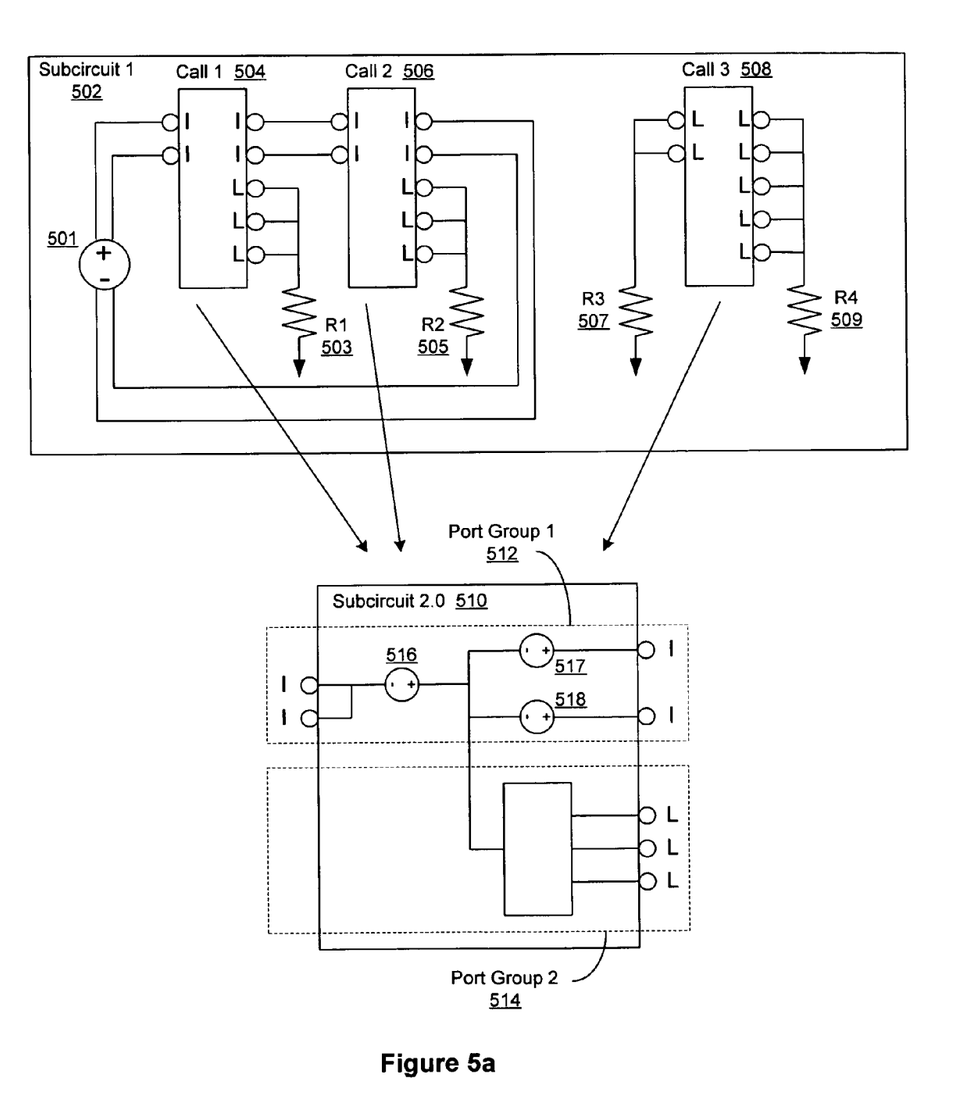
FIG. 5a illustrates a hierarchical netlist after the bottom-up node marking process according to an embodiment of the present invention.
Figure 5B:
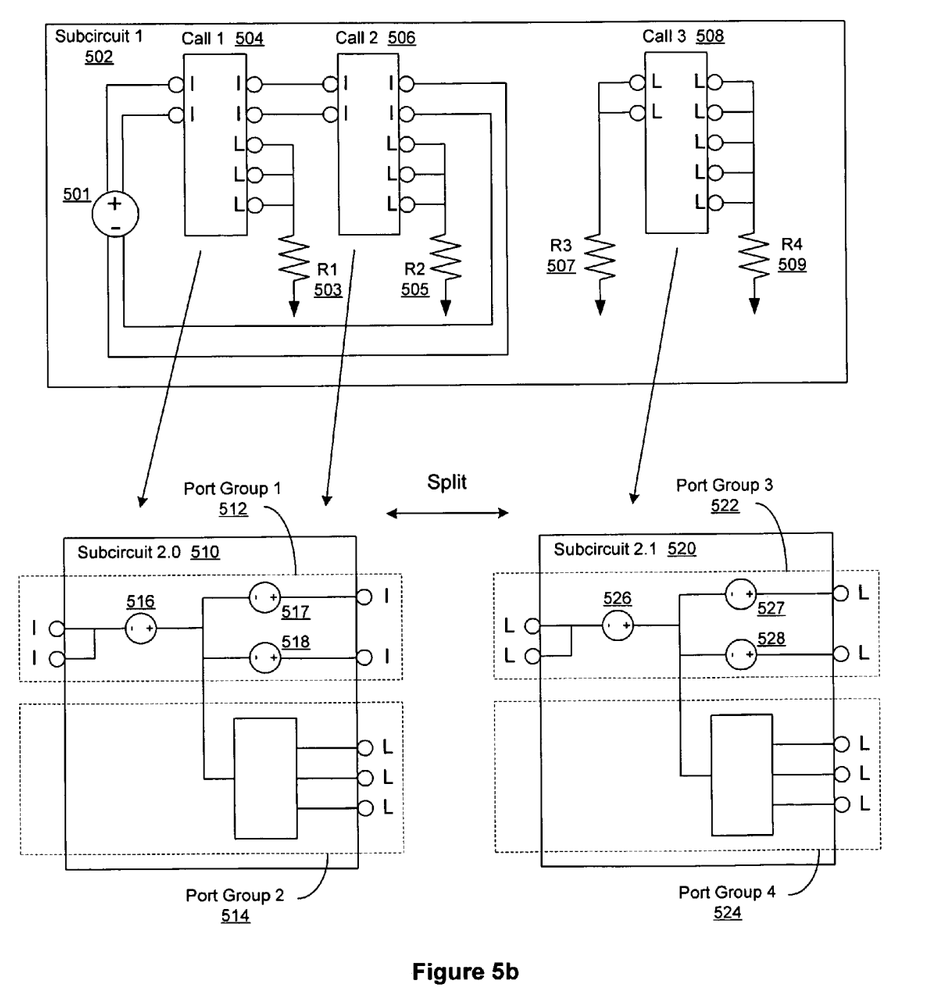
FIG. 5b illustrates modifications of the hierarchical netlist after a split of subcircuit 2.0 of FIG. 5a according to an embodiment of the present invention.

FIGS. 5a and 5b illustrate a method for adaptively modifying a hierarchical netlist according to an embodiment of the present invention. The modifications are made based on the port-group information recorded in the bottom-up node marking process and the connectivity information available in the top-down path tracing process. FIG. 5a illustrates a hierarchical netlist after the bottom-up node marking process according to an embodiment of the present invention. As shown in FIG. 5a, a subcircuit 1 (502) includes three functional calls, namely Call 1 (504), Call 2 (506), and Call 3 (508). Each of the three functional calls references the subcircuit 2.0 (510). The subcircuit 2.0 (510) includes a first port-group (512) and a second port-group (514). The first port-group contains voltage sources 516, 517, and 518 as part of a potentially illegal voltage source and/or inductor loop. The input ports and output ports of each functional call are marked to be potentially legal (L) or potentially illegal (I) by the bottom-up process described previously. For example, the two input ports of Call 1 are marked I, two of the output ports are marked I, and three of the output ports are marked L. Similarly for Call 2 (506), the two input ports are marked I, two of the output ports are marked I, and three of the output ports are marked L. The two input ports and two output ports of Call 1 and Call 2 are marked I respectively because they are part of the illegal V-L loop formed with the voltage source

501. On the other hand, the lower three output ports of Call 1 and Call 2 are marked L because they are coupled to circuit ground through the resistors R1 (503) and R2 (504), respectively.

However, for Call 3 (508), all input ports and output ports are marked L because they are coupled to circuit ground through the resistors R3 (507) and R4 (509), respectively. Therefore, the functional calls Call 1, Call 2, and Call 3 may not reference to the same subcircuit 2.0 in a hierarchical data structure due to the different isomorphic properties at the input and output ports of the functional calls. This issue is addressed in the description of FIG. 5*b* below.

FIG. 5*b* illustrates modifications of the hierarchical netlist after a split of subcircuit 2.0 of FIG. 5*a* according to an embodiment of the present invention. As shown in FIG. 5*b*, Call 1 (504) and Call 2 (506), both having the same input and output port properties, may still reference subcircuit 2.0 (510). However, Call 3 (508), having different input and output port properties than Call 1 and Call 2, references to subcircuit to subcircuit 2.1 (520). In other words, the subcircuit 2.0 of FIG. 5*a* is split into two subcircuits namely, subcircuit 2.0 and subcircuit 2.1. The subcircuit 2.1 (520) includes a third port-group (522) and a fourth port-group (524). The third port-group contains voltage sources 526, 527, and 528 as part of a voltage source and/or inductor path. Note that the subcircuit 2.1 has both its input ports and output ports marked L because they are coupled to circuit ground through the resistors R3 (507) and R4 (509), respectively. Upon modifying the hierarchical netlist of FIG. 5*a*, the simulation is performed on the modified netlist as shown in FIG. 5*b*.

The disclosed system and method for validating a hierarchical simulation database increases the product quality of the simulator, prevents simulation issues such as illegal voltage source and/or inductor loops from RC reduction, simulation slow-down with large partitions, non-convergence, or singular matrix. Most importantly, the disclosed system and method save designers time in running and debugging the hierarchical netlist, therefore significantly shortening the product development cycle.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for validating a circuit for simulation, comprising:
   representing the circuit in a hierarchical data structure, wherein the hierarchical data structure comprises a plurality of subcircuits arranged in a connected graph, wherein each subcircuit comprises circuit elements and one or more input and output ports;
   traversing the hierarchical data structure in a bottom-up fashion;
   recording input port to output port (port-to-port) properties of the subcircuits in the hierarchical data structure, wherein recording port-to-port properties includes determining potentially illegal paths within each subcircuit in accordance with a set of predetermined rules;
   traversing the hierarchical data structure in a top-down fashion; and
   identifying illegal port paths using the port-to-port properties of the subcircuits.

2. The method of claim 1, wherein traversing the hierarchical data structure in a bottom-up fashion comprises:
   traversing the hierarchical data structure in a breadth-first-search.

3. The method of claim 1, wherein traversing the hierarchical data structure in a bottom-up fashion comprises:
   traversing the hierarchical data structure in a depth-first-search.

4. The method of claim 1, wherein recording port-to-port properties further comprises:
   marking each input port and output port as either a legal port or a potentially illegal port in accordance with the potentially illegal paths within each subcircuit; and
   grouping input and output ports of each subcircuit into one or more port groups.

5. The method of claim 1, wherein identifying illegal port paths comprises:
   detecting voltage source(s) only paths; and
   reporting the voltage source(s) only paths.

6. The method of claim 1, wherein identifying illegal port paths comprises:
   detecting inductor(s) only paths; and
   reporting the inductor(s) only paths.

7. The method of claim 1, wherein identifying illegal port paths comprises:
   detecting voltage source(s) and/or inductor(s) paths; and
   reporting the voltage source(s) and/or inductor(s) paths.

8. The method of claim 1, wherein identifying illegal port paths further comprises:
   detecting illegal port paths using connectivity information of the subcircuits.

9. The method of claim 1 further comprises:
   communicating port-to-port properties of the plurality of subcircuits in the hierarchical data structure;

grouping functional calls to the plurality of subcircuits according to commonality of port-to-port properties; and simulating the plurality of subcircuits using the functional calls.

10. The method of claim 1 further comprises:

communicating port-to-port properties of the plurality of subcircuits in the hierarchical data structure;

splitting subcircuits if corresponding functional calls have different port-to-port properties; and simulating the subcircuits using the functional calls.

11. A system for validating a circuit for simulation, comprising:

at least one processing unit for executing computer programs;

a graphical user interface for viewing representations of the circuit on a display;

a memory for storing information of the circuit;

logic for representing the circuit in a hierarchical data structure, wherein the hierarchical data structure comprises a plurality of subcircuits arranged in a connected graph, wherein each subcircuit comprises circuit elements and one or more input and output parts;

logic for traversing the hierarchical data structure in a bottom-up fashion;

logic for recording input port to output port (port-to-port) properties of the subcircuits in the hierarchical data structure, wherein the logic for recording port-to-port properties includes logic for determining potentially illegal paths within each subcircuit in accordance with a set of predetermined rules;

logic for traversing the hierarchical data structure in a top-down fashion; and logic for identifying illegal port paths using the port-to-port properties of the subcircuits.

12. The system of claim 11, wherein logic for traversing the hierarchical data structure in a bottom-up fashion comprises:

logic for traversing the hierarchical data structure in a breadth-first-search.

13. The system of claim 11, wherein logic for traversing the hierarchical data structure in a bottom-up fashion comprises:

logic for traversing the hierarchical data structure in a depth-first-search.

14. The system of claim 11, wherein logic for recording port-to-port properties further comprises:

logic for marking each input port and output port as either a legal port or a potentially illegal port in accordance with the potentially illegal paths within each subcircuit; and logic for grouping input and output ports of each subcircuit into one or more port groups.

15. The system of claim 11, wherein logic for identifying illegal port paths comprises:

logic for detecting voltage source(s) only paths; and
logic for reporting the voltage source(s) only paths.

16. The system of claim 11, wherein logic for identifying illegal port paths comprises:

logic for detecting inductor(s) only paths; and
logic for reporting the inductor(s) only paths.

17. The system of claim 11, wherein logic for identifying illegal port paths comprises:

logic for detecting voltage source(s) and/or inductor(s) paths; and logic for reporting the voltage source(s) and/or inductor(s) paths.

18. The system of claim 11, wherein logic for identifying illegal port paths further comprises:

logic for detecting illegal port paths using connectivity information of the subcircuits.

19. The system of claim 11 further comprises:

logic for communicating port-to-port properties of the plurality of subcircuits in the hierarchical data structure;

logic for grouping functional calls to the plurality of subcircuits according to commonality of port-to-port properties; and logic for simulating the plurality of subcircuits using the functional calls.

20. The system of claim 11 further comprises:

logic for communicating port-to-port properties of the plurality of subcircuits in the hierarchical data structure;

logic for splitting subcircuits if corresponding functional calls have different port-to-port properties; and logic for simulating the subcircuits using the functional calls.

21. A computer program product for validating a circuit for simulation, comprising a medium storing computer programs for execution by one or more computer systems having at least a processing unit, a user interface and a memory, the computer program product comprising:

code for representing the circuit in a hierarchical data structure, wherein the hierarchical data structure comprises a plurality of subcircuits arranged in a connected graph, wherein each subcircuit comprises circuit elements and one or more input and output ports;

code for traversing the hierarchical data structure in a bottom-up fashion;

code for recording input port to output port (port-to-port) properties of the subcircuits in the hierarchical data structure, wherein the code for recording port-to-port properties includes code for determining potentially illegal paths within each subcircuit in accordance with a set of predetermined rules;

code for traversing the hierarchical data structure in a top-down fashion; and code for identifying illegal port paths using the port-to-port properties of the subcircuits.

22. The computer program product of claim 21, wherein code for traversing the hierarchical data structure in a bottom-up fashion comprises:

code for traversing the hierarchical data structure in a breadth-first-search.

23. The computer program product of claim 21, wherein code for traversing the hierarchical data structure in a bottom-up fashion comprises:

code for traversing the hierarchical data structure in a depth-first-search.

24. The computer program product of claim 21, wherein code for recording port-to-port properties further comprises:

code for marking each input port and output port as either a legal port or a potentially illegal port in accordance with the potentially illegal paths within each subcircuit; and code for grouping input and output ports of each subcircuit into one or more port groups.

25. The computer program product of claim 21, wherein code for identifying illegal port paths comprises:

code for detecting voltage source(s) only paths; and
code for reporting the voltage source(s) only paths.

26. The computer program product of claim 21, wherein code for identifying illegal port paths comprises:

code for detecting inductor(s) only paths; and
code for reporting the inductor(s) only paths.

27. The computer program product of claim 21, wherein code for identifying illegal port paths comprises:

code for detecting voltage source(s) and/or inductor(s) paths; and code for reporting the voltage source(s) and/or inductor(s) paths.

28. The computer program product of claim 21, wherein code for identifying illegal port paths further comprises:

code for detecting illegal port paths using connectivity information of the subcircuits.

29. The computer program product of claim 21 further comprises;

code for communicating port-to-port properties of the plurality of subcircuits in the hierarchical data structure;

code for grouping functional calls to the plurality of subcircuits according to commonality of port-to-port properties; and code for simulating the plurality of subcircuits using the functional calls.

30. The computer program product of claim 21 further comprises:

code for communicating port-to-port properties of the plurality of subcircuits in the hierarchical data structure;

code for splitting subcircuits if corresponding functional calls have different port-to-port properties; and code for simulating the subcircuits using the functional calls.

* * * * *